United States Patent
Vivio et al.

[11] Patent Number: 5,867,642
[45] Date of Patent: Feb. 2, 1999

[54] SYSTEM AND METHOD TO COHERENTLY AND DYNAMICALLY REMAP AN AT-RISK MEMORY AREA BY SIMULTANEOUSLY WRITING TWO MEMORY AREAS

[75] Inventors: Joseph Vivio; Richard Chan, both of Austin, Tex.

[73] Assignee: Dell USA, L.P., Round Rock, Tex.

[21] Appl. No.: 512,691

[22] Filed: Aug. 10, 1995

[51] Int. Cl.$^6$ .................................................. G06F 12/16
[52] U.S. Cl. ....................................................... 395/182.06
[58] Field of Search ...................... 395/182.05, 182.06, 395/183.18, 185.01, 185.07; 371/21.1, 40.1, 40.2, 49.1; 364/243, 245.3, 265, 268.5, 268.9, 269.2, 281.9, 944, 944.2, 945

[56] References Cited

U.S. PATENT DOCUMENTS

| | | | |
|---|---|---|---|
| 4,488,298 | 12/1984 | Bond et al. ................................ | 371/11 |
| 5,077,736 | 12/1991 | Dunphy, Jr. et al. ................... | 371/10.1 |
| 5,185,875 | 2/1993 | Chinnaswamy et al. ............... | 395/425 |
| 5,199,033 | 3/1993 | McGeoch et al. ...................... | 371/10.1 |
| 5,235,700 | 8/1993 | Alaiwan et al. ........................ | 395/575 |
| 5,239,659 | 8/1993 | Rudeseal et al. ....................... | 395/800 |
| 5,267,242 | 11/1993 | Lavallee et al. ........................ | 371/10.1 |
| 5,321,697 | 6/1994 | Fromm et al. .......................... | 371/10.1 |
| 5,369,650 | 11/1994 | Kirk et al. .............................. | 371/40.1 |
| 5,371,882 | 12/1994 | Ludlam .................................. | 395/575 |
| 5,404,361 | 4/1995 | Casorso etal. .......................... | 371/40.1 |
| 5,412,788 | 5/1995 | Collins et al. .......................... | 395/425 |
| 5,499,337 | 3/1996 | Gordon ............................... | 395/182.04 |
| 5,566,316 | 10/1996 | Fechner et al. ......................... | 395/441 |

*Primary Examiner*—Robert W. Beausoliel, Jr.
*Assistant Examiner*—Stephen C. Elmore
*Attorney, Agent, or Firm*— Skjerven,Morrill,MacPherson, Franklin & Friel L.L.P.

[57] ABSTRACT

In a computer system comprising a CPU, main memory, and a memory controller, a system and method to dynamically remap memory while maintaining memory coherency. The main memory is divided into memory areas, one of which is a reserve memory area. Memory accesses are checked for errors and the errors are logged, as is the memory area in which the error occurred. The error log for each memory area is compared to an acceptable error frequency level. If a particular memory area exceeds the acceptable error frequency level, the memory area will be dynamically remapped to the reserve memory area while memory coherency is maintained. The dynamic remapping is performed by copying the memory from the memory area which exceeded the acceptable error frequency level, to the reserve memory are. During the copying, all writes to the memory area which exceeded the acceptable error frequency level are concurrently performed to both the memory area which exceeded the acceptable error frequency level and to the reserve memory area, thus preserving memory coherency. Also, the copying is performed in small blocks to avoid system timing problems.

29 Claims, 4 Drawing Sheets

SYSTEM AND METHOD TO COHERENTLY AND DYNAMICALLY REMAP AN AT-RISK MEMORY AREA BY SIMULTANEOUSLY WRITING TWO MEMORY AREAS

SPECIFICATION

FIELD OF THE INVENTION

The present invention relates to memory controllers and system memory in computer systems, and more specifically to a system and method for dynamic, coherent remapping of system memory.

DESCRIPTION OF THE RELATED ART

A typical computer system includes a central processing unit (CPU), main memory, and a memory controller. The CPU operates on instructions and data which are stored in the main memory as combinations of bits referred to as words. The CPU accesses a word in main memory by generating address and control signals. The address corresponds to the location of the word in main memory, and the control signals indicate whether the word is to be read or written.

The main memory is typically comprised of random access memory (RAM) cells. One type of RAM typically used for main memory in modern computer systems is dynamic random access memory (DRAM). DRAM is organized as an array including rows and columns of memory cells where one bit is stored in a cell. A number of DRAM arrays are combined in parallel to form the correct word width, and a word is accessed by providing a row address and column address to the DRAM. Normally, the row address and column address are multiplexed on the same signals to obtain a smaller more cost effective structure. The row address is latched in the DRAM by a row address strobe (RAS) and the column address is latched by a column address strobe (CAS). A given row and column address selects a word location to be read or written.

Larger memory systems have multiple banks of DRAM having separate RAS and CAS signals to distinguish between banks. The DRAM forming each bank is often grouped on single in-line memory modules (SIMMs). Various sizes and organizations of SIMMs are often employed. Other structures, such as dual in-line memory modules (DIMMs) are also employed.

The reliability of the memory is of paramount concern to designers and users of computer systems. There are two types of errors in DRAMs: soft errors which are non-permanent and hard errors which usually are permanent. Soft errors are usually caused by radiation-induced switching of a bit in a memory cell, and usually this type of error causes no lasting damage to the memory cell. Hard errors are due to the unexpected deterioration or destruction of one or more memory cells. Static discharge or deterioration over time are often the source of hard errors. Generally, hard errors result in the defective DRAM or SIMM being replaced.

Memory errors have a devastating result on the operation of the computer system, regardless of whether the error is hard or soft. Erroneous data or a bad program instruction may result. These errors can not be tolerated in some systems, such as servers which supply information to other computers and may be part of a critical system, like a banking system. To avoid the problems caused by memory errors, computer system designers often implement error checking within the memory system.

Parity checking is a common means of error checking. Parity checking involves storing a bit with every byte of information that indicates the internal consistency of that byte. Generally this is as simple as determining if there is an odd number of ones in the byte. Every time a byte is accessed, the parity bit is checked to determine if the byte is consistent with the parity indication. If a parity error is found, system operation is usually halted since the results could be catastrophic.

However, many computer systems are used in applications that can not tolerate system operation being halted. A technique that is used in systems that cannot tolerate being shut down by parity errors is to store an error correction code (ECC) with each word in memory. The ECC allows single bit errors, which would normally cause a parity error, to be detected and corrected without effecting system operation. Typical ECC systems only correct single bit errors. If a multiple bit error is detected, it is treated as a parity error and system operation is shut down. Often, if single bit errors are frequently being detected (and corrected) in the same memory area, it is an indication that more serious memory failures may soon occur in that memory area.

To avoid the occurrence of a multi-bit error, which would shut down system operation, some systems employ redundant memory. If the primary memory begins to fail, the system switches over to the secondary memory. However, redundant memory has the disadvantage of requiring twice as much memory as a non-redundant system. Therefore, in redundant memory systems, the memory costs twice as much and may require twice as much area in the system.

Another possible solution to avoid multi-bit errors is to use a smaller reserve memory. If a primary memory area begins to fail, the affected memory is copied into the reserve memory. However, all memory accesses must be halted until the copying is completed or memory coherency problems could result from other system devices accessing the memory before copying was completed. However, many devices and applications are extremely timing sensitive and cannot tolerate having their access to memory halted for the length of time required to copy an area of memory to a reserve area of memory. Thus, system crashes may result while the affected memory is being copied to the reserve memory.

It is desired to have a memory system that can dynamically remap memory to a reserve memory without affecting system operation and while also maintaining memory coherency. The desired memory system would be much more cost and area effective than a redundant memory system and would avoid any memory coherency and timing problems.

SUMMARY OF THE INVENTION

The present invention provides a system and method to dynamically remap data from a potentially faulty memory area to a reserve memory area while maintaining memory coherency. The present invention performs remapping of memory without denying accesses to memory or interrupting applications for relatively long periods of time. Thus, the present invention avoids errors for devices and applications that can not tolerate long delays in accessing memory.

According to the present invention, a system management controller logs non-fatal memory errors detected by an error detection and correction (EDC) memory system. Nonfatal memory errors are memory errors which are corrected by the EDC memory system and do not result in system operation being halted. In the preferred embodiment, the system management controller comprises system management software.

In the preferred embodiment of the invention, the system memory is located on a plurality of single in-line memory modules (SIMMs). If the system management software logs a certain number of corrected errors in a memory region located in a particular SIMM, the software determines that the SIMM integrity is beginning to fail. In order to avoid any fatal errors in the suspect SIMM, the system management software relocates, or remaps, the memory regions mapped to the suspect SIMM to a reserve SIMM.

According to the present invention, determining when SIMM integrity is beginning to fail may be accomplished by: determining an error frequency level that indicates one of the SIMMs is at risk for failure, detecting if an error occurs whenever SIMMs are accessed, tracking the frequency of the errors detected in each one of the SIMMs, and for each one of SIMMs, comparing the frequency of the errors detected in each one of SIMMs to the error frequency level and thereby determining if one of the SIMMs is at risk for failure.

The invention includes a memory controller which has the capability to target memory writes to two SIMMs simultaneously. In the preferred embodiment of this invention, the memory controller comprises a single application specific integrated circuit. In other embodiments, the memory controller comprises multiple devices. When the system management software decides to remap memory from a suspect SIMM to a reserve SIMM, the memory controller is programmed to perform all writes mapped to the suspect SIMM to both the suspect SIMM and the reserve SIMM simultaneously. The system management software also proceeds to copy memory from the suspect SIMM to the reserve SIMM. The memory is copied in small blocks over a period of time so that the processor is only interrupted for a short amount of time during each block copy.

While the remapping operation is taking place, any writes to the memory regions located in the suspect SIMM are performed to both the suspect SIMM and the reserve SIMM. Thus, memory coherency is preserved. Reads are targeted to the initial SIMM until all blocks have been copied. When all copying has completed, the system management software programs the memory controller to target all memory accesses (reads and writes) to the reserve SIMM, and the suspect SIMM is no longer used.

In some embodiments of the invention, the system management software sends an alert message indicating that the suspect SIMM should be replaced the next time the system is down for maintenance. Also, if the level of fault tolerance provided by the dynamic remapping scheme of the present invention is not required, the reserved SIMM may instead be selected to be used as a regular SIMM to provide additional system memory.

Therefore, the present invention comprises a system and method for dynamically remapping memory to a reserve memory while maintaining memory coherency. The present invention performs main memory remapping without denying devices and applications access to memory for an extended period of time.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
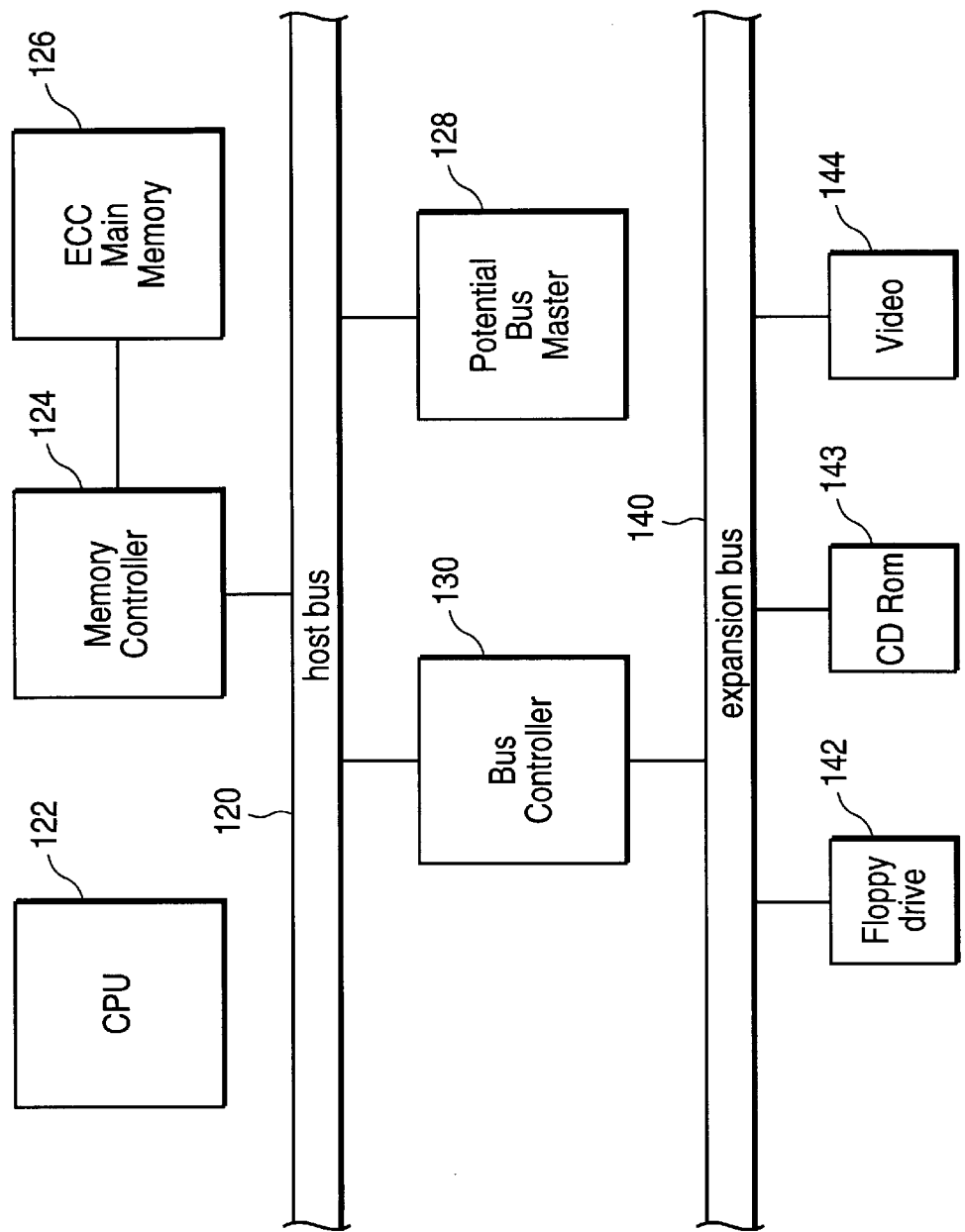
FIG. 1 is a block diagram illustrating a computer system according to one embodiment of the invention.

Referring now to FIG. 1, a computer system incorporating logic according to the present invention is shown. The computer system of FIG. 1 is illustrative only, and the present invention may be incorporated into various types of computer systems. Also, the elements of a computer system not necessary to understand the operation of the present invention have been omitted for simplicity.

The computer system includes a central processing unit or CPU 122 which is coupled to a host bus 120. The host bus 120 includes address, data, and control portions. ECC main memory 126 is coupled to the host bus 120 by means of memory controller 124. A potential bus master 128, such as another microprocessor or a high performance drive array controller, is also coupled to the host bus 120. In other embodiments of the invention, multiple potential bus masters are coupled to the host bus 120. Alternatively, a secondary host-style bus, such as the Peripheral Component Interconnect bus (PCI) is coupled to the host bus 120, and bus master devices coupled to the PCI bus access the ECC main memory 126. The host bus 120 is coupled to an expansion or input/output (I/0) bus 140 by means of a bus controller 130. The expansion bus 140 may be the PCI bus or may be an older type expansion bus, such as the AT bus or EISA (Extended Industry Standard Architecture) bus. The expansion bus 140 includes slots for various other devices, including video 144, a floppy drive 142 and CD ROM 143, as desired. One or more of the devices coupled to the expansion bus 140 may act as bus masters which access the main memory 126.

The ECC main memory 126 is accessed through the memory controller 124 by the CPU 122, potential bus master 128, or bus controller 130. The CPU 122 accesses the ECC main memory 126 by generating a memory cycle on the host bus 120. The memory cycle contains address, data, and control portions. The memory controller 124 uses the address and control portions to determine the memory location to be accessed and if the cycle is a read or write cycle. The actual data to be read from or stored in the ECC main memory 126 is transferred on the data portion.

The potential bus master 128 accesses the ECC main memory 126 in a similar manner to the CPU 122 after it has arbitrated for control of the bus. The bus controller 130 normally accesses the ECC main memory 126 by direct memory access (DMA) cycles to or from one of the expansion bus devices. DMA cycles allow expansion bus devices to transfer data to or from the ECC main memory 126 without intervention of the CPU 122.

Figure 2:
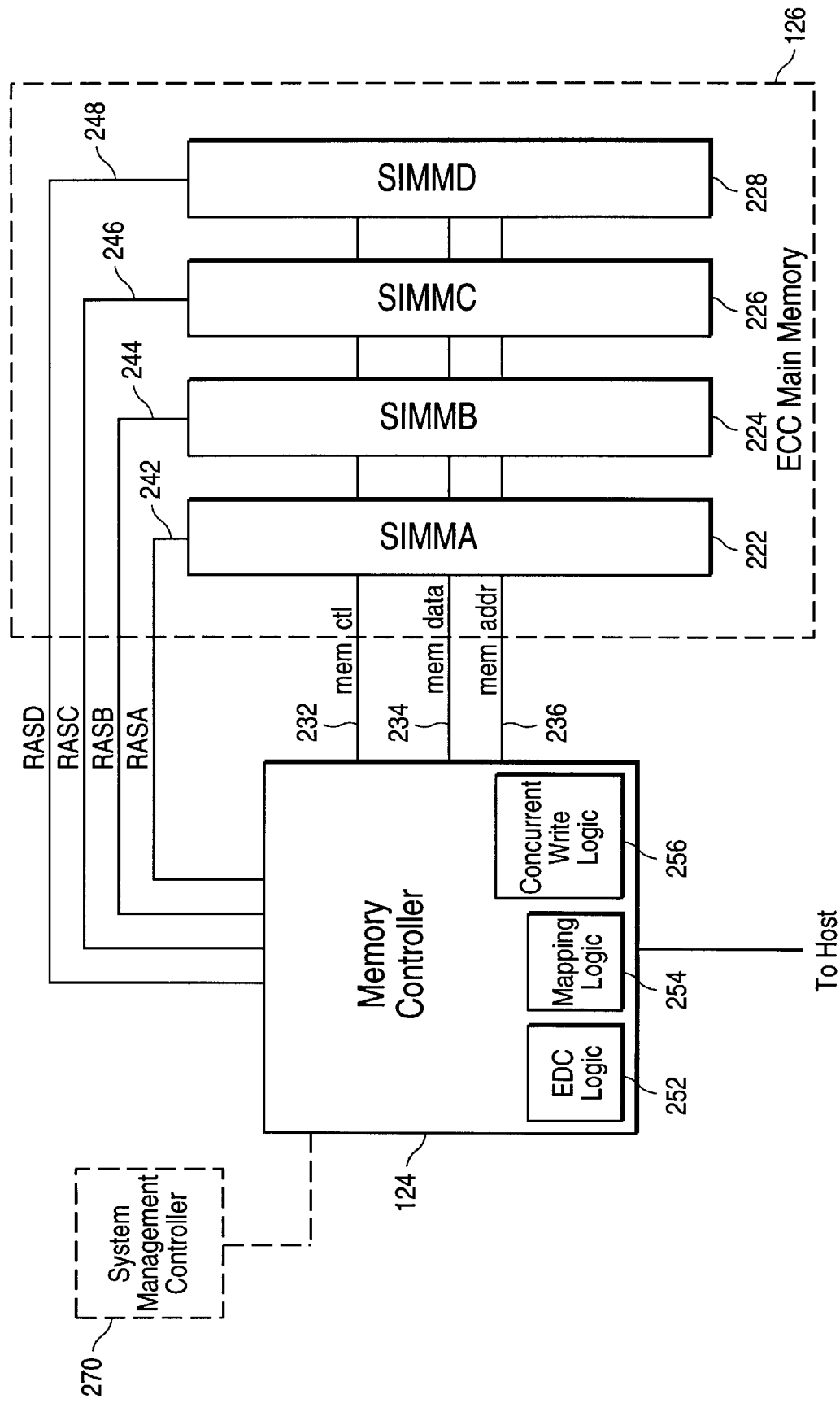
FIG. 2 is a block diagram illustrating the memory system of FIG. 1 according to the preferred embodiment of the present invention.

Referring now to FIG. 2, the ECC main memory 126 is preferably comprised of single in-line memory modules (SIMMs) containing dynamic random access memory (DRAM) integrated circuits and includes DRAM for storing error correction codes. Other types of memory modules, such as dual in-line memory modules (DIMMs), are used in other embodiments of the invention. Also, other types of integrated storage circuits besides DRAM could be used in other embodiments of the invention. In the shown embodiment of the invention, four SIMMs are shown: SIMM A 222, SIMMB 224, SIMMC 226, and SIMMD 228. The SIMMs plug into connectors (not shown) so that they may easily be added or removed.

As noted above, the ECC main memory 126 is coupled to the memory controller 124. The memory controller 124 includes error detection and correction (EDC) logic 252. When a word is written to the ECC main memory 126, the memory controller 124 calculates the error correction code for the word and stores it in the appropriate memory location with the word. When a word is read, the memory controller 124 uses the ECC portion to detect if the word contains any errors. In the preferred embodiment of the invention, if a single bit error is detected, the error is corrected using the error correction code. Double bit errors are detected but not corrected. In other embodiments of the invention, more complex error correction codes are used to correct multi-bit errors. The mechanism by which error correction codes are used to detect and correct memory word bit errors is well understood by those skilled in the art to which this invention pertains, and a complete explanation of error correction code operation is not necessary for an understanding of this invention.

The ECC memory 126 is coupled to the memory controller 124 through memory control signals 232, memory data signals 234, and memory address signals 236. The memory control signals 232 are generated by the memory controller 124 in response to memory cycles on the host bus 120. The memory control signals 232 comprise the column address strobe (CAS) signals and signals to indicate read and write operations. The memory controller 124 also generates column and row addresses on the memory address signals 236 based on the address portion of the host cycles. The column and row addresses are normally multiplexed on the same lines. The CAS signals and row address strobe (RAS) signals are used to indicate to the DRAM if a row or a column address is present on the memory address signals 236.

Each SIMM receives a different RAS signal as indicated by RASA 242, RASB, 244, RASC 246, and RASD 248. If necessary, each of the individual RAS signals may comprise multiple RAS signals to handle a greater load of DRAM circuits. Data is transferred to or from the ECC main memory 126 on the memory data signals 234, and the data is provided to or received from the host bus 120 data portion by the memory controller 124.

In other embodiments of the invention, the ECC main memory 126 is organized differently, including different memory architectures and different RAS/CAS structures. Also, one or more of the memory control, address, and data signals connect directly to the host bus 120 in other embodiments. The principals of the invention still apply for other memory embodiments.

Each time a read cycle is performed to the ECC main memory 126, the error detection and correction logic 252 in the memory controller 124 checks the word being accessed for errors. If a single bit error is detected, the error detection and correction logic 252 corrects the error using the error correction code stored with the accessed word. The error detection and correction logic 252 then indicates the occurrence of the corrected error and the location of the error, by generating an interrupt to the CPU 122. The SIMM which contained the error is indicated in a register in the memory controller 124. The interrupt is processed by a system management controller, which preferably comprises system management software executed by the CPU 122. In other embodiments of the present invention, the system management controller may be implemented or partially implemented as a separate hardware controller coupled to the memory controller, or software executing on such a controller, as shown by the dashed box 270 in FIG. 2. Alternatively the system management controller may be implemented as circuitry within the memory controller.

For correctable errors, system operation is not affected. The error is corrected and indicated by generation of the interrupt. If the error detection and correction logic 252 detects an error that can not be corrected, such as a double bit error, the error is treated as a parity error in non-EDC systems and system operation is halted after a warning message has been generated.

When the error interrupt is processed, the system management controller reads a register in the memory controller 124 to determine which SIMM contained the error. The system management controller logs, i.e. stores, the error occurrence and the SIMM location of the error. This error log is used to determine when a particular SIMM becomes at risk for failure. The determination of when a SIMM becomes at risk is performed by the system management controller by comparing the frequency of errors logged for a particular SIMM to an acceptable error frequency level. When the error frequency logged for a particular SIMM exceeds the acceptable error frequency level, the SIMM is determined to be at risk for failure. The acceptable error frequency level is preferably selected by the user of the computer system through a set-up type program. Alternatively, the acceptable error frequency level could be a fixed number. The acceptable error frequency level could indicate an acceptable number of errors over a certain period of time, or just an acceptable total error number.

The memory controller 124 also includes concurrent write logic 256. When the concurrent write logic 256 is enabled, the memory controller 124 performs all write accesses mapped to a particular SIMM to both the particular SIMM and a reserve SIMM, concurrently. Thus, the data from the write access is written to both SIMMs. This concurrent write is performed by activating the RAS signals for both SIMMs at the same time during the appropriate phase of the write access.

Once a particular SIMM is determined to be at increased risk for failure, the system management controller enables the concurrent write logic 256 in the memory controller 124, to perform all write accesses mapped to the at risk SIMM to both the at risk SIMM and the reserve SIMM. The system management controller also copies the memory of the at risk SIMM to the reserve SIMM in small blocks. The concurrent write logic 256 is enabled during the copying to maintain memory coherency. Memory coherency could be lost if all write accesses directed to the at risk SIMM are not written to both the at risk SIMM and the reserve SIMM during the entire time that copy operations are being performed. This is because other devices, such as the bus controller 130 or potential bus master 128, could access (write to) memory that had already been copied to the reserve SIMM, and thus the reserve SIMM would no longer contain the correct data. Therefore, the concurrent write feature of the invention maintains memory coherency by assuring that all writes during the entire copy operation are also sent to the reserve SIMM.

As mentioned above, the entire copy operation is broken into a plurality of smaller copy operations. The smaller copy operations are necessary because, during copying, other applications and some devices cannot access the memory. Some applications and devices will fail without regular access to memory. Therefore, the copy operation is broken into multiple short copy operations so as not to deny any application or device access to memory for an extended period of time.

The memory controller 124 also includes mapping logic 254 that determines the respective SIMM where memory accesses are performed (or mapped). The mapping logic 254 also changes the mapping of memory accesses between respective SIMMs. Upon the completion of the copy operation, the system management controller programs the mapping logic 254 in the memory controller 124 to map all accesses which were previously mapped to the at risk SIMM to the reserve SIMM. The system management controller also disables the concurrent write logic 256.

Once the memory controller 124 is programmed to remap the write accesses to the reserve SIMM, the at risk SIMM is no longer accessed. Thus, memory has been dynamically remapped from an at risk for failure SIMM to a reserve SIMM while maintaining memory coherency, and without affecting system operation or denying other applications or devices from accessing memory for an extended period of time.

In the preferred embodiment of the invention, the user of the computer system can choose whether or not to reserve one of the ECC main memory 126 SIMMs for use as the reserve SIMM in the dynamic memory remapping technique described above. If the user decides he does not need the protection provided by the dynamic memory remapping technique, or if a maximum amount of main memory is required, the user may select to use all SIMMs for main memory and thus maximize the amount of available main memory. The user selection may be performed through a set-up program as is common in modern computer systems.

In one embodiment of the invention, when an at risk SIMM is detected and the dynamic memory remapping to the reserve SIMM is completed, the system management controller will generate a warning message to the computer system user indicating which SIMM is the at risk SIMM so that it may be replaced next time the system is down for maintenance. The message could be displayed by the video 144 device on a monitor, or written to a message file.

Figure 3:
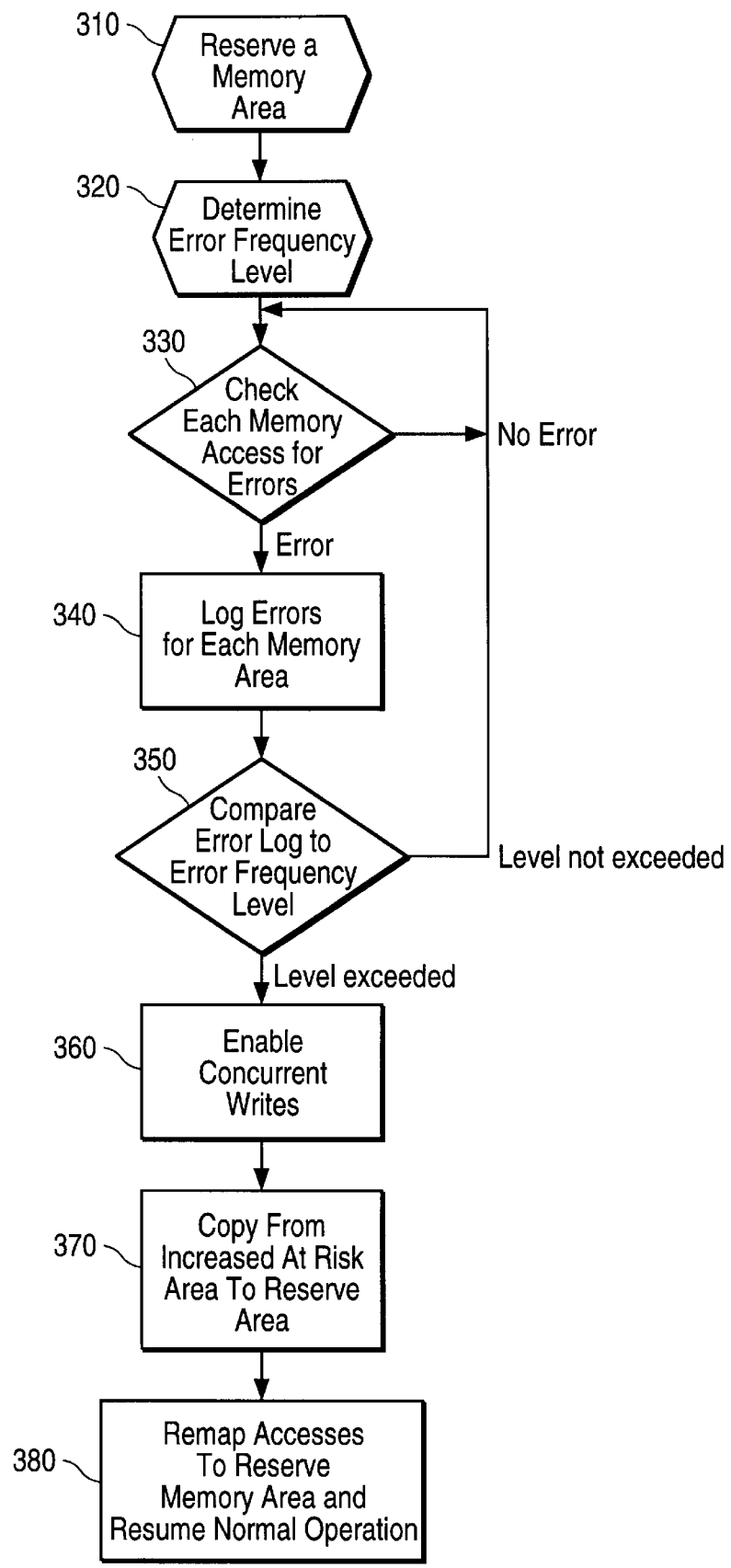
FIG. 3 is a flow diagram illustrating the dynamic memory remapping method according to one embodiment of the present invention.

FIG. 3 shows a method flow diagram for one embodiment of the above described technique for dynamically remapping memory while maintaining memory coherency. The elements of the method are briefly restated below.

An area of memory is reserved and an acceptable error frequency level is determined, as shown by 310 and 320, respectively. For each memory access, the accessed memory area is checked for an error, as shown by 330. If an error is found, it is logged for the memory area from which it occurred, as shown in 340. The error log for each memory area is compared to the error frequency level determined in 320, as shown by 350. If the level is not exceeded, normal operation continues. If the level is exceeded, concurrent writes are enabled 360, and the memory area which exceeded the level is copied 370 in small blocks to the reserve memory area. When copying is completed, accesses are remapped to the reserve memory area 380, and normal operation is resumed. When the system is shut down for maintenance, the memory area which exceeded the level, or memory module including the memory area which exceeded the level, is replaced. In an alternate embodiment, the memory area which exceeded the level may be replaced without shutting the system down. The replaced memory area becomes a new reserved memory area.

Therefore, a system and method is disclosed for dynamically remapping memory from an at risk memory area, to a reserve memory area while maintaining memory coherency, and without affecting system operation or denying other applications or devices from accessing memory for an extended period of time.

Figure 4:
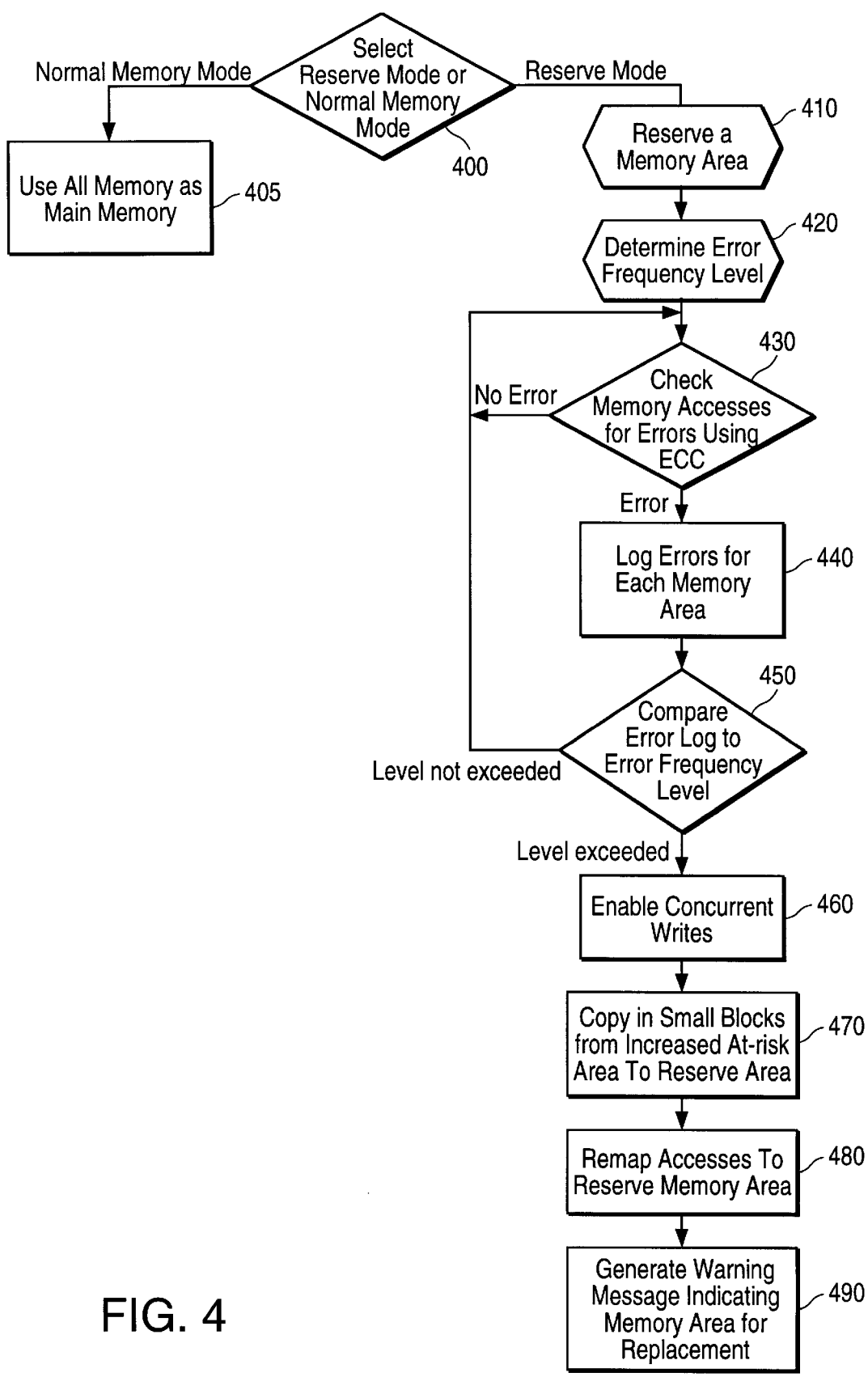
FIG. 4 is a flow diagram illustrating the dynamic memory remapping method according to another embodiment of the present invention.

FIG. 4 shows a more detailed flow diagram for one embodiment of the present invention. A reserve memory mode or a normal memory mode is selected, as shown at 400. As described above, when the normal memory mode is selected, all memory is used for main memory thereby maximizing the amount of available main memory. Normal memory mode operation is shown at 405. When reserve memory mode is chosen, the system operates as describe for FIG. 3. Steps 410–480 operate as described for steps 310–380 respectively in FIG. 3. Note however, step 430 indicates that the error checking is performed using error correction codes Although the system and method of the present invention have been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. In a computer system comprising a central processing unit (CPU), a memory controller coupled to the CPU, and a memory coupled to the memory controller, wherein the memory is divided into areas, wherein the CPU performs read and write accesses of the memory through the memory controller, the computer system further comprising at least one other device performing write accesses of the memory through the memory controller, a method for dynamically remapping an at risk memory area to a reserve memory area, the method comprising:

determining if one of said memory areas is at risk for failure;

concurrently performing all write accesses of said at risk memory area to both said at risk memory area and to said reserve memory area, wherein said concurrently performing all write accesses is performed in response to determining that one of said memory areas is at risk for failure;

copying said at risk memory area to said reserve memory area, wherein said copying is performed in response to determining that one of said memory areas is at risk for failure;

wherein said concurrently performing all write accesses continues until said copying is completed and wherein memory coherency is maintained during said copying; and upon completion of said copying, mapping all accesses which were previously mapped to said at risk memory area, to said reserve memory area only, wherein said at risk memory area is no longer accessed.

2. The method of claim 1, wherein said determining if one of said memory areas is at risk comprises:

determining an error frequency level that indicates one of said memory areas is at risk for failure;

detecting if an error occurs whenever said memory areas are accessed;

tracking the frequency of said errors detected in each one of said memory areas; and for each one of said memory areas, comparing said frequency of said errors detected in each one of said memory areas to said error frequency level and thereby determining if one of said memory areas is at risk for failure.

3. The method of claim 2, wherein said detecting comprises using error correction codes stored in said memory to detect errors without halting system operation.

4. The method of claim 2, wherein said tracking comprises:
   interrupting said CPU when one of said errors is detected for said one of said memory areas; and
   logging the occurrence of said one of said errors for said one of said memory areas, wherein said logging is performed, in response to said interrupting, by a system management computer program executed by said CPU.

5. The method of claim 2, wherein said comparing is performed by a system management computer program executed by said CPU.

6. The method of claim 1, wherein said memory controller asserts a row address strobe (RAS) for one of said memory areas when said one of said memory areas is accessed; and
   wherein said concurrently performing all write accesses of said at risk memory area comprises programming said memory controller to concurrently assert both the row address strobe for said at risk memory area and the row address strobe for said reserve memory area during said write accesses.

7. The method of claim 6, wherein said programming said memory controller to assert both the row address strobe for said at risk memory area and the row address strobe for said reserve memory area during said write accesses is performed by a system management computer program executed by said CPU.

8. The method of claim 1, wherein said computer system farther comprises devices and applications that require frequent accesses to said memory;
   wherein said copying is performed by a system management computer program executed by said CPU; and
   wherein said copying is performed in small blocks, wherein said copying of each of said blocks is performed in a relatively small amount of time so that said copying does not prevent said devices and applications that require frequent accesses to said memory from accessing said memory for an extended amount of time.

9. The method of claim 1, wherein said mapping all accesses which were previously mapped to said at risk memory area to said reserve memory area only is performed by a system management computer program executed by said CPU.

10. The method of claim 1, wherein each of said memory areas comprise a single in-line memory module, the method further comprising generating a message identifying the single in-line memory module associated with said at risk memory area and recommending replacement of said single in-line memory module.

11. The method of claim 1 further comprising selecting between a first mode and a second mode, wherein when said first mode is selected, said determining, said performing, said copying, and said programming are performed; but when said second mode is selected, said determining, said performing, said copying, and said programing are not performed and said reserve memory area is used as a normal memory area, thereby increasing the total amount of memory available.

12. A system for coherent, dynamic remapping of memory in a computer system from an at risk memory area to a reserve memory area, comprising:
   a central processing unit (CPU);
   a memory controller coupled to said CPU and comprising error detection and correction logic, concurrent write logic, and mapping logic;
   memory, coupled to said memory controller, physically divided into areas, wherein one of said memory areas is a reserve memory area used for remapping of at risk memory, and wherein said CPU performs read and write accesses of said memory through said memory controller; and
   a bus master device which performs write accesses of said memory through said memory controller;
   wherein said error detection and correction logic detects if an error occurs when each of said memory areas is accessed and stores error information associated with each of said memory areas;
   wherein one of said memory areas is copied to said reserve memory area in response to said error detection and correction logic detecting a first number of errors in one of said memory areas;
   wherein said concurrent write logic operates in response to said error detection and correction logic detecting said first number of errors in one of said memory areas to concurrently perform all write accesses directed to said one of said memory areas to both said one of said memory areas and to said reserve memory area; wherein memory coherency is maintained when said one of said memory areas is copied to said reserve memory area; and
   wherein said mapping logic operates in response to said detection and correction logic detecting said first number of errors in one of said memory areas to change mapping of said read and write accesses from one of said memory areas to said reserve memory area.

13. The system of claim 12 wherein each of said memory areas comprises a single in-line memory module.

14. The system of claim 12 wherein each of said memory areas comprises error correction codes used by said error detection and correction logic to correct simple errors in said memory areas without halting system operation.

15. The system of claim 12, wherein each of said memory areas has an associated row address strobe (RAS), and wherein said concurrent write logic performs said concurrently performed writes by concurrently asserting both the row address strobe for said one of said memory areas and the row address strobe for said reserve memory area during said write accesses.

16. The system of claim 12, further comprising a plurality of subcontrollers which include:
   a subcontroller configured to determine if one of said memory areas is at risk based upon said error information stored by said error detection and correction logic;
   a subcontroller configured to operate said concurrent write logic to concurrently perform all writes directed to said at risk memory area, to both said at risk memory area and to said reserve memory area;
   a subcontroller configured to copy said at risk memory area to said reserve memory area; and
   a subcontroller configured to operate said mapping logic to map said read and write accesses previously mapped to said at risk memory area to said reserve memory area.

17. The system of claim 16, wherein said subcontroller configured to copy said at risk memory area to said reserve memory area is further configured to copy said at risk memory area to said reserve memory area in small blocks, wherein each of said blocks is copied in a relatively short amount of time so that devices and applications that require frequent access to said memory are not prevented from accessing said memory for an extended amount of time.

18. The system of claim 17, wherein said subcontroller configured to determine if one of said memory areas is at risk comprises:
- a subcontroller configured to determine an error frequency level that indicates one of said memory areas is at risk for failure;
- a subcontroller configured to retrieve said error information from said error detection and correction logic each time said errors occur;
- a subcontroller configured to track the frequency of said errors detected in each one of said memory areas; and
- a subcontroller configured to compare said frequency to said error frequency level for said each one of said memory areas, and thereby determining if one of said memory areas is at risk.

19. The system of claim 18, wherein at least one of said plurality of subcontrollers comprises a computer program executed on said CPU.

20. The system of claim 18, wherein said system further comprises a system management controller coupled to said memory controller, and wherein at least one of said plurality of subcontrollers comprises a computer program executed on said system management controller.

21. The system of claim 18, wherein at least one of said plurality of subcontrollers comprises circuitry within said memory controller.

22. The system of claim 12, further comprising:
- means for determining if one of said memory areas is at risk based upon said error information stored by said error detection and correction logic;
- means for operating said concurrent write logic to concurrently perform all writes directed to said at risk memory area, to both said at risk memory area and to said reserve memory area;
- means for operating said CPU to copy said at risk memory area to said reserve memory area; and
- means for operating said mapping logic to map said read and write accesses previously mapped to said at risk memory area to said reserve memory area.

23. The system of claim 22, wherein said computer system comprises devices and applications that require frequent accesses to said memory; and wherein said means for operating said CPU to copy said at risk memory area to said reserve memory area is further configured to operate said CPU to copy said at risk memory area to said reserve memory area in small blocks, wherein each of said blocks is copied in a relatively short amount of time so that said devices and applications that require frequent access to said memory are not prevented from accessing said memory for an extended amount of time.

24. The system of claim 23, wherein said means for determining if one of said memory areas is at risk comprises:
- means for determining an error frequency level that indicates one of said memory areas is at risk for failure;
- means for retrieving said error information from said error detection and correction logic each time said errors occur;
- means for tracking the frequency of said errors detected in each one of said memory areas; and
- means for comparing said frequency to said error frequency level for said each one of said memory areas, and thereby performing said determining if one of said memory areas is at risk.

25. The system of claim 24, wherein each said means comprises a computer program executed on said CPU.

26. The system of claim 12, wherein said CPU determines if one of said memory areas is at risk based upon said error information stored by said error detection and correction logic;
- wherein said CPU operates said concurrent write logic to concurrently perform all writes directed to said at risk memory area, to both said at risk memory area and to said reserve memory area;
- wherein said CPU copies said at risk memory area to said reserve memory area; and
- wherein said CPU operates said mapping logic to map said read and write accesses previously mapped to said at risk memory area to said reserve memory area.

27. The system of claim 26, wherein said CPU copies said at risk memory area to said reserve memory area in small blocks, wherein said CPU copies each of said blocks in a relatively short amount of time so that said devices and applications that require frequent access to said memory are not prevented from accessing said memory for an extended amount of time.

28. The system of claim 27, wherein said CPU determines an error frequency level that indicates one of said memory areas is at risk for failure;
- wherein said CPU retrieves said error information from said error detection and correction logic each time said errors occur;
- wherein said CPU tracks the frequency of said errors detected in each one of said memory areas; and
- wherein said CPU compares said frequency to said error frequency level for said each one of said memory areas, and thereby performing said determining if one of said memory areas is at risk.

29. A memory controller for a computer system comprising a central processing unit (CPU) and memory areas, wherein the CPU performs read and write accesses of the memory areas through the memory controller, the memory controller comprising:
- error detection and correction logic for detecting if an error occurs when each of said memory areas is accessed, and for storing error information associated with each of said memory areas;
- wherein said CPU copies one of said memory areas to a reserve memory area in response to said detection and correction logic detecting a first number of errors in one of said memory areas;
- concurrent write logic for concurrently performing all write accesses directed to one OF said memory areas to both said one of said memory areas and to said reserve memory area in response to said detection and correction logic detecting said first number of errors in one of said memory areas, wherein memory coherency is maintained when said CPU copies one of said memory areas to said reserve memory area; and
- mapping logic for mapping of read and write accesses to said memory areas, wherein said mapping logic changes mapping of said read and write accesses from one of said memory areas to said reserve memory area in response to said detection and correction logic detecting said first number of errors in one of said memory areas.

* * * * *